(12) United States Patent
Hembree et al.

(10) Patent No.: US 7,049,700 B2
(45) Date of Patent: May 23, 2006

(54) SEMICONDUCTOR TEST BOARD HAVING LASER PATTERNED CONDUCTORS

(75) Inventors: David R. Hembree, Boise, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/983,111

(22) Filed: Nov. 5, 2004

(65) Prior Publication Data

US 2005/0084986 A1    Apr. 21, 2005

Related U.S. Application Data

(62) Division of application No. 09/933,492, filed on Aug. 20, 2001, which is a division of application No. 09/824,152, filed on Apr. 2, 2001, now Pat. No. 6,472,239.

(51) Int. Cl.
*H01L 23/48* (2006.01)
*H01L 23/52* (2006.01)
*H01L 23/40* (2006.01)
*H01L 21/66* (2006.01)
*G01R 31/26* (2006.01)

(52) U.S. Cl. .......................... 257/760; 438/14; 438/11; 257/758

(58) Field of Classification Search ................ 438/11, 438/14, 258, 758, 759, 760
See application file for complete search history.

(56) References Cited

U.S. PATENT DOCUMENTS

| 5,255,051 A | 10/1993 | Allen |
| 5,327,338 A | 7/1994 | Allen et al. |
| 5,386,221 A | 1/1995 | Allen et al. |
| 5,594,273 A | 1/1997 | Dasse et al. |
| 5,786,632 A | 7/1998 | Farnworth |
| 5,806,181 A | 9/1998 | Khandros |
| 5,851,911 A | 12/1998 | Farnworth |
| 5,876,902 A | 3/1999 | Veneklasen et al. |
| 5,895,581 A | 4/1999 | Grunwald |

(Continued)

FOREIGN PATENT DOCUMENTS

JP    2-134840    5/1990

OTHER PUBLICATIONS

Ali R. Ehsani & Matt Kesler, Lasers Speed Up Board Production, May 2002, IEEE Spectrum, pp. 40-45.

(Continued)

*Primary Examiner*—Michael Lebentritt
*Assistant Examiner*—Walter L. Lindsay, Jr.
(74) *Attorney, Agent, or Firm*—Stephen A. Gratton

(57) ABSTRACT

A method for fabricating semiconductor components is performed using a laser scanner and a laser imaging process. A substrate, such as a semiconductor wafer, containing multiple semiconductor components, such as dice or packages, is provided. The components include integrated circuits, and component contacts in electrical communication with the integrated circuits. Initially, the components are tested to identify and locate good components and defective components on the substrate. Using data from the testing step and the laser scanner, patterns of conductors are then formed to either repair the defective components, to electrically isolate the defective components for burn-in, or to form component clusters containing only the good components. Alternately, using data from the testing step and the laser scanner, a matching test board can be fabricated, and used to electrically engage the good components, while the defective components remain isolated.

11 Claims, 8 Drawing Sheets

U.S. PATENT DOCUMENTS

| | | | |
|---|---|---|---|
| 5,990,566 A | 11/1999 | Farnworth et al. | |
| 6,037,967 A | 3/2000 | Allen et al. | |
| 6,048,753 A | 4/2000 | Farnworth et al. | |
| 6,088,379 A | 7/2000 | Owa et al. | |
| 6,107,119 A | 8/2000 | Farnworth et al. | |
| 6,110,823 A | 8/2000 | Eldridge et al. | |
| 6,115,175 A | 9/2000 | Maruyama et al. | |
| 6,214,630 B1 * | 4/2001 | Hsuan et al. | 438/11 |
| 6,262,390 B1 | 7/2001 | Goland et al. | |
| 6,277,660 B1 * | 8/2001 | Zakel et al. | 438/14 |
| 6,303,977 B1 * | 10/2001 | Schroen et al. | 257/758 |
| 6,399,400 B1 * | 6/2002 | Osann et al. | 438/14 |
| 6,427,324 B1 | 8/2002 | Franklin et al. | |
| 6,462,575 B1 | 10/2002 | Cram | |
| 6,472,239 B1 | 10/2002 | Hembree et al. | |
| 6,555,841 B1 * | 4/2003 | Sakushima et al. | 257/760 |
| 6,600,171 B1 | 7/2003 | Farnworth et al. | |
| 6,620,638 B1 * | 9/2003 | Farrar | 438/14 |
| 6,653,732 B1 * | 11/2003 | Alpern et al. | 257/760 |
| 6,680,213 B1 | 1/2004 | Farnworth et al. | |
| 6,858,447 B1 * | 2/2005 | Hartmann et al. | 438/14 |
| 6,884,642 B1 * | 4/2005 | Farnworth et al. | 438/15 |
| 6,885,955 B1 * | 4/2005 | Atchison | 438/14 |
| 6,887,724 B1 * | 5/2005 | Nakamura et al. | 438/14 |
| 6,905,966 B1 * | 6/2005 | Morita | 438/14 |
| 2004/0175850 A1 * | 9/2004 | Shimizu et al. | 438/14 |

OTHER PUBLICATIONS

DuPont Printed Circuit Maerials, Riston LaserSeries, Technical brochure, pp. 1-8, H-73185.

DuPont Photopolymer & Electronic Materials, Technical Data, Riston Aqueous-processable Photopolymer Films, General Processing Guide, pp. 1-15, DS 97-41, (Dec. 1997).

* cited by examiner

SEMICONDUCTOR TEST BOARD HAVING LASER PATTERNED CONDUCTORS

CROSS REFERENCE TO RELATED APPLICATIONS

This application is a division of Ser. No. 09/933,492, filed Aug. 20, 2001, which is a division of Ser. No. 09/824,152, filed Apr. 2, 2001, U.S. Pat. No. 6,472,239 B2.

FIELD OF THE INVENTION

This invention relates generally to semiconductor manufacture and testing, and more particularly to a method for fabricating and testing semiconductor components.

BACKGROUND OF THE INVENTION

Photolithography is widely used in semiconductor manufacture and other applications. During photolithography, an exposure energy, such as ultraviolet light, is passed through a mask and onto a target such as a semiconductor wafer. The mask contains opaque and transparent regions which form a primary mask pattern. The exposure energy exposes the mask pattern on a layer of resist deposited on the target. Following exposure, the layer of resist can be developed to form a resist mask. In semiconductor manufacture, such a resist mask can be used for etching, ion implantation, screen printing, CVD and other processes.

One recently developed form of lithography uses a laser scanner to focus modulated laser beams in a series of scan lines onto a radiant sensitive film of resist. This technique eliminates the mask, as the pattern is written directly onto the resist. A conventional laser scanner includes a laser adapted to generate a collimated light beam, that can be split into an array of collimated sub beams. Typically, the laser beam comprises ultraviolet light having a wavelength of 325 nm or 363.8 nm. The laser scanner also includes a modulator, such as an acousto-optic modulator, adapted to receive a data signal in digital form, and to modulate the laser beam responsive to the data signal. In addition, the laser scanner includes scan optics, such as a rotating reflective polygon, adapted to form an image of the beam and to sweep the image across a scan line. The laser scanner also includes a precision stage adapted to move the target in X and Y directions approximately perpendicular to the scan line direction.

The present invention employs a laser scanner and direct laser imaging to improve various wafer level fabrication and test processes for semiconductor components. For example, semiconductor dice, semiconductor packages, and semiconductor interconnects are typically fabricated on a single substrate (e.g., wafer or panel) that is subsequently singulated into individual components. These processes are sometimes referred to as being "wafer level" processes.

One shortcoming of wafer level fabrication processes is that some of the components on the substrate can be defective. For example, defects can occur in the integrated circuits contained on the components, in the address circuitry for the components, or in the configuration of the arrays of semiconductor devices on the components. Some defects can make a component non-functional, while other defects merely affect the electrical characteristics of the component.

The defective components can decrease the yield of the substrate and affect the quality of the singulated components. In addition, the defective components can compromise subsequent test procedures, particularly wafer level burn-in tests. For example, conventional burn-in boards utilize "shared resources" wherein multiple components are electrically connected in series, and the same test signals are applied to multiple components. Defective components can short the test signals, and adversely affect the test process.

Rather than having specific defects, other semiconductor components can have electrical characteristics that do not meet certain standards. For example, one important electrical characteristic is the speed with which the components process signals. Some functional components can have speed characteristics that make the components unsuitable for a particular application. Again the substandard components can decrease the yield of the substrate.

The present invention utilizes a laser scanner and direct laser imaging to improve wafer level fabrication and test processes for semiconductor components.

SUMMARY OF THE INVENTION

In accordance with the present invention, a method for fabricating and testing semiconductor components is provided. Also provided are improved semiconductor components fabricated using the method, and a system configured to perform the method.

Initially, a substrate having a plurality of semiconductor components is provided. For example, the substrate can comprises a semiconductor wafer, or a portion thereof, containing multiple semiconductor dice or semiconductor packages. In addition, the components on the substrate can include component contacts, such as bond pads, in electrical communication with integrated circuits contained on the components.

As a first step, the components on the substrate are tested to "evaluate" and "map" the components. The testing step can include "functional" tests for evaluating a gross functionality of the components, as well as "parametric" tests for evaluating various electrical characteristics of the components (e.g., speed). The testing step identifies and locates both "defective" components and "good" components on the substrate.

A metal redistribution layer is then blanket deposited on the substrate, and on the component contacts. Next, a radiant sensitive film, such as a wet film resist, or a dry film resist, is blanket deposited on the redistribution layer. The radiant sensitive film is then exposed using a laser scanner programmed with digital data representative of a desired pattern of conductors. In addition, the digital data includes test data from the initial testing step. Development of the exposed radiant sensitive film forms a mask that can be used to etch the pattern of conductors on each component. Such an etching process is known in the art as a "subtractive" process. However, a laser imaged mask can also be used to form the conductors using an additive process (i.e., deposition of a metal through the mask).

The conductors are-configured to "fan out", or other wise locate, terminal contacts for the components in a required pattern, such as a grid array. In addition, using the test data, the conductors can be configured to repair or re-configure selected components, such as defective or substandard components. Alternately, the conductors can be configured to isolate defective components for wafer level burn-in, or to form component clusters configured to improve "wafer yield" by excluding selected components.

As another alternative, using the test data, a matching test board can be fabricated that is configured to electrically engage the good components on the wafer, while the defective components are electrically isolated. The test board can also be fabricated using a laser scanner and a laser imaging process employing essentially the same data used to pattern the redistribution layer.

In an alternate embodiment of the method, a semiconductor package is fabricated with a solder mask, or a rigidifying mask, patterned using a laser scanner and a laser imaging process.

DETAILED DESCRIPTION OF THE PREFERRED EMBODIMENTS

Figure 1:
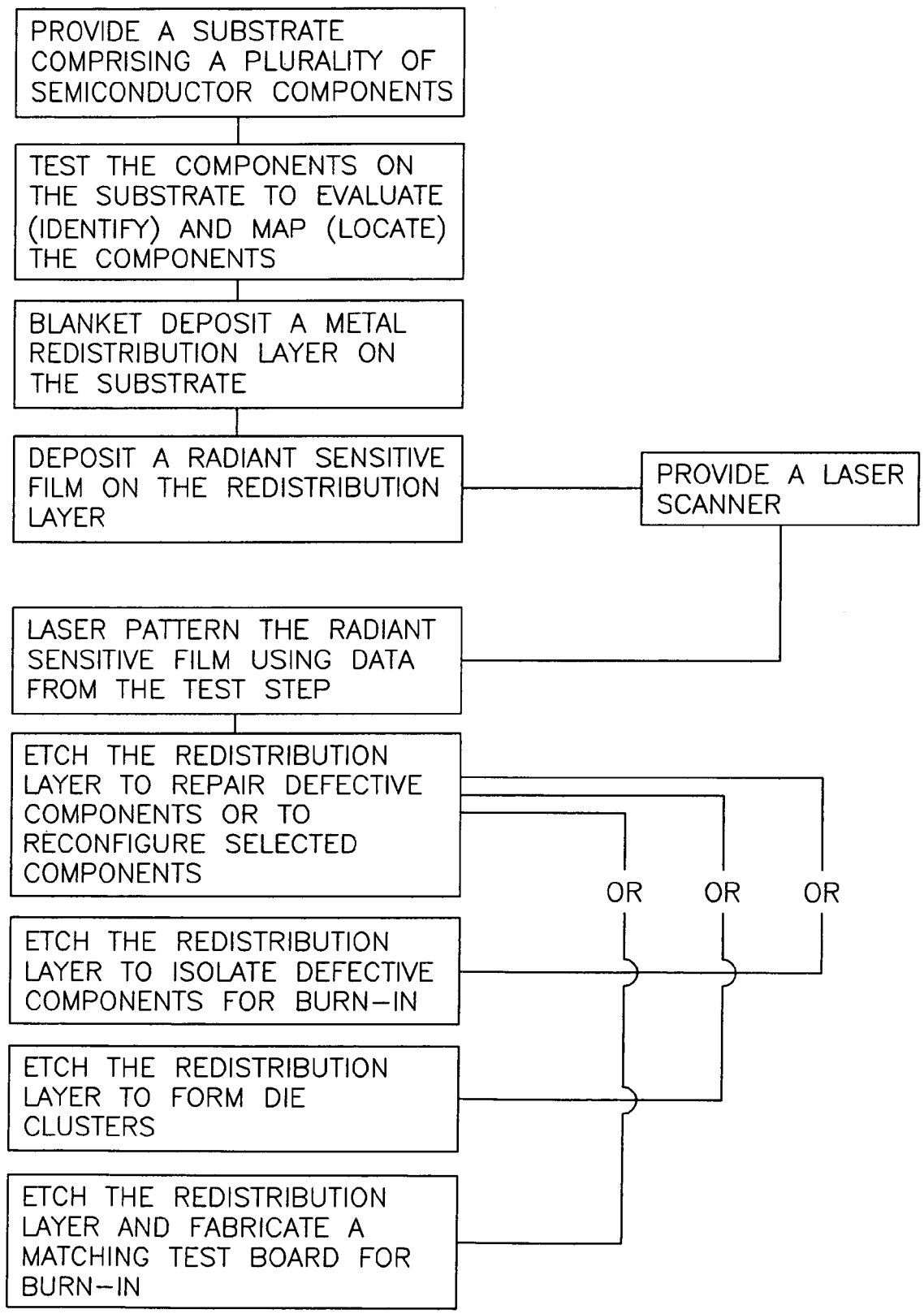
FIG. 1 is a block diagram illustrating steps in the method of the invention for fabricating semiconductor components.

Referring to FIG. 1, and to FIGS. 2A–2F, broad steps in a method for fabricating semiconductor components in accordance with the invention are illustrated. In the illustrative embodiment the components comprise semiconductor dice, or semiconductor packages (e.g., chip scale packages or minimally packaged dice).

Figure 2A:
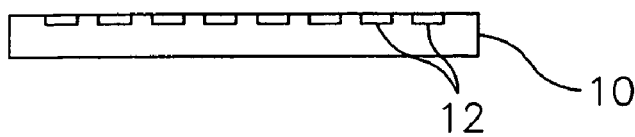
FIGS. 2A–2F are schematic cross sectional views illustrating broad steps in a "subtractive" embodiment of the method.

Initially, as shown in FIG. 2A, a semiconductor substrate 10 containing a plurality of semiconductor components 12 is provided. For example, the substrate 10 can comprise a wafer, or a portion thereof, made of a conventional semiconductor material, such as silicon or gallium arsenide, on which semiconductor dice have been formed using well known processes, such as doping, CVD and etching. As another example, the substrate 10 can comprise a panel containing a plurality of semiconductor packages. In this case the substrate 10 can be made of an organic material, such as a glass filled resin, such as epoxy glass (FR-4), polyimide glass, or a cyanate-glass material. In either case, the components 12 include integrated circuits and component contacts 28 (FIG. 3A), such as bond pads, in electrical communication with the integrated circuits contained on the components 12.

Figure 2B:
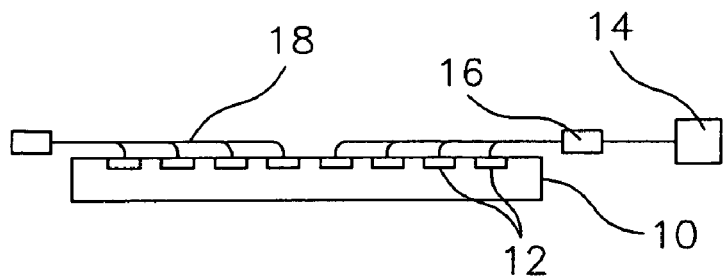

Next, as shown in FIG. 2B, the components 12 are tested on the substrate 10 to "evaluate" and "map" the components 12. For example, the testing step can be used to "identify" defective components 12D (FIG. 4) and to "locate" the defective components 12D, as well as the "good" components 12. The testing step can be performed using techniques and equipment that are known in the art.

As used herein the term "evaluate" means to measure or assess various physical or electrical characteristics of the components 12.

The term "map" means to determine a location of "defective" and "good" components on the substrate.

The term "defective component" means a component having electrical characteristics that do not meet required standards for a particular application. For example, physical and electrical defects, such as short circuits, open circuits, leaking contacts, and cracked insulating layers, can make a component non-functional and thus defective. Alternately, a functional component may not have an identifiable physical or electrical defect, yet can still be considered defective for a particular application. For example, a component that does not meet a required standard for speed may be considered "functional" yet "defective" for making chip scale packages. However, the component may not be defective for other applications, such as making conventional plastic semiconductor packages.

The term "good component" means a component having electrical characteristics that meet required standards for a particular application.

One well known wafer level test is referred to as wafer probe. For performing a wafer probe, a tester containing test circuitry 14 (FIG. 2B) is provided. The test circuitry 14 is configured to generate and apply test signals to the integrated circuits and electrical devices contained on the components 12. Also provided is a probe card 16 in electrical communication with the test circuitry 14. The probe card 16 includes probe contacts 18 configured to electrically engage the component contacts 28 (FIG. 3A), and to provide separate electrical paths for applying the test signals to the components 12.

In general, the test circuitry 14 can be configured to test various electrical characteristics of the components 12. One electrical characteristic that can be evaluated is the "gross functionality" of each component 12. Such a test can include powering up an individual component 12, and then performing write, modify, or read operations on each of the data paths (i.e., DQs) into and out of the component 12. For example, in the case of a 4×die, zeros can be written to each of the four DQ's (four memory cells) and read. Next, the zeros can be changed to "1s" and checked to confirm the change has occurred. If the change occurs, the die is referred to as being "grossly" functional.

As another example, the test circuitry 14 can be configured to detect cell to cell defects in components 12 that contain memory cells. To detect cell to cell defects, high voltage values (logical "1") can be written to selected memory cells of an individual component 12. At the same time low voltage values (logical "0") can be written to adjacent memory cells. The test circuitry 14 then determines whether the adjacent memory cells maintain a logical "0" value. If not, then the logical "1" value written to the selected memory cells has shorted, indicating a cell defect.

Another test that can be performed using the test circuitry 14 (FIG. 2B) is known as a "Walking 1" test. With a "Walking 1" test, an entire array on a component 12 is set to zeros and a "1" is written to the first address. The "1" is then read. As a next step, the entire array is set to zeros, a "1" is written to the second address, and then read. This procedure is repeated through all of the addresses of the array.

The test circuitry 14 can also be configured to test for opens, shorts, and current leakage between the component contacts 28 (FIG. 3A) on each component 12. Opens and shorts can be detected using a continuity circuit configured to test for opens and shorts between selected component contacts 28.

In general each of the above test procedures is referred to as "functional testing". However, the testing step can also include "parametric testing" such as speed grading or bin sorting. In this case the electrical characteristics relative to the "performance" of the components are evaluated. The parametric testing can be used to identify components on the substrate 10 that are functional, but which may not possess certain characteristics. For example, some of the components 12 may be faster than other of the components 12 and more suitable for particular applications. In general the faster components are termed as "premium" components, and command a higher price. Other of the components 12 may be completely functional, yet not able to meet premium standards.

Figure 2C:
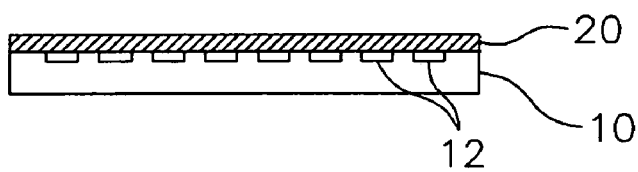
Figure 2F:
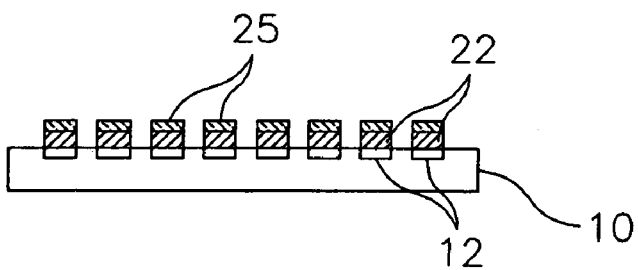
Figure 3:
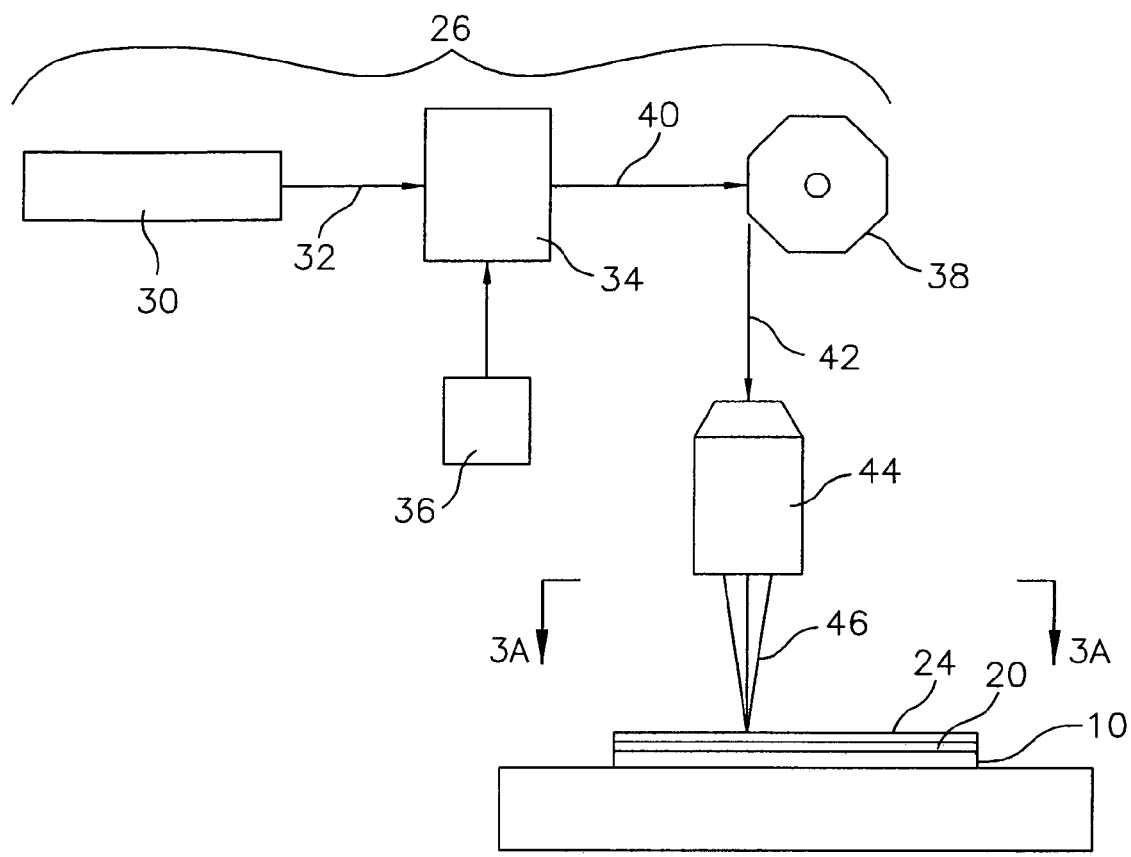
FIG. 3 is a schematic diagram of a laser scanner suitable for performing a laser imaging step of the method.
Figure 3A:
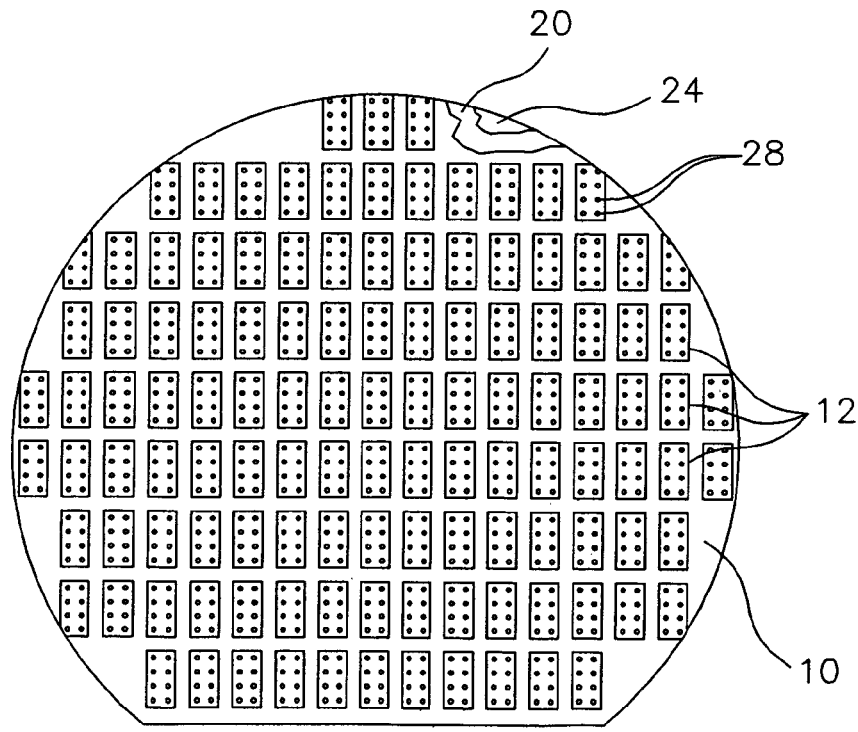
FIG. 3A is a partially cut away plan view taken along line 3A—3A of FIG. 3 illustrating a semiconductor substrate during laser imaging.

Following the initial wafer level test to evaluate the components 12, and as shown in FIG. 2C, a metal redistribution layer 20 is blanket deposited on the surface of the substrate 10 and on the component contacts 28 (FIG. 3A). The redistribution layer 20 can be deposited to a desired thickness using a suitable deposition process such as CVD, PECVD, LPCVD or sputtering. The redistribution layer 20 will be subsequently patterned to form patterns of conductors 22 (FIG. 2F) on the components 12. In addition, the conductors 22 can be configured to locate or "fan out" terminal contacts (e.g., solder balls) for the components 12 in a desired pattern, such as a dense grid array. Redistribution layers are well known in the art of semiconductor manufacture for configuring different types of components. For example, semiconductor dice can be fabricated with bond pads in standard configurations. U.S. Pat. No. 6,048,753 to Farnworth et al. discloses a standardized bonding location process and apparatus.

Figure 2D:
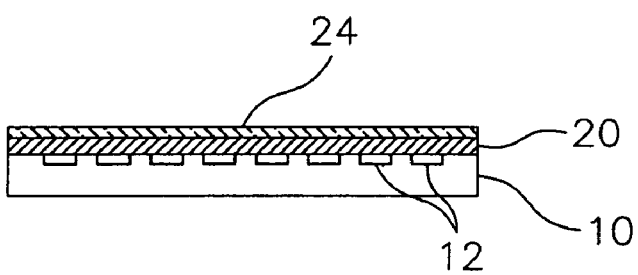

Next, as shown in FIG. 2D, a radiant sensitive film 24 is formed on the redistribution layer 20. The radiant sensitive film 24 will be subsequently exposed and developed to form a mask 25 (FIG. 2F) for etching the redistribution layer 20 to form the patterns of conductors 22 (FIG. 2F). The radiant sensitive film 24 can comprise a conventional "wet film" photo resist configured for exposure by UV radiation. Exemplary photo resists are manufactured by Shipley under the trademarks "APEX-E" and "UV-III". The wet film photo resist can be formed as a layer with a desired thickness (e.g., 10,000 Å to 15,000 Å) using a conventional deposition process, such as a "spin on" process, followed by "soft bake" if required.

As another alternative, the radiant sensitive film 24 can comprise a "dry film" photopolymer resist manufactured by E.I. duPont de Nemours and Company under the trademark "RISTON". One suitable resist is designated "RISTON" LaserSeries LDI 300 hi-speed direct imaging resist. These dry film resists can be applied to the redistribution layer 20 using a laminator apparatus and a lamination process.

Figure 2E:
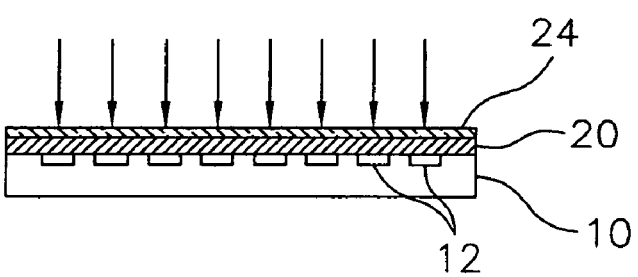

Next, as shown in FIG. 2E, the radiant sensitive film 24 is exposed using a laser imaging process. For laser imaging the radiant sensitive film 24, a laser scanner 26 (FIG. 3) is provided. The laser scanner 26 can be a commercially available unit available from a manufacturer such as Etec Systems, Inc., of Hayward, Calif. and Tucson, Ariz. One suitable laser scanner manufactured by Etec Systems, Inc. is the "DIGIRITE 2000" UV Laser Direct Imaging System. Other laser scanners are described in U.S. Pat. Nos. 5,255,051; 5,327,338; 5,386,221; and 6,037,967.

A conventional laser scanner 26 is illustrated schematically in FIG. 3. The laser scanner 26 includes a laser 30 configured to generate a laser beam 32. For example, the laser beam 32 can comprise ultraviolet light at a selected wavelength (e.g., 325 nm (nanometers) or 363.8 nm), pulsed at a frequency of from 1 to 300 MHz.

The laser scanner 26 also includes a modulator 34 having an optical input port configured to receive the laser beam 32. In addition, the modulator 34 includes an electrical input port configured to receive digital data 36 (i.e., software). The digital data 36 represents a selected pattern that will be "written" or "laser imaged" on the radiant sensitive film 24. In addition, the laser beam 32 is typically split into a plurality of separate beams such that the modulator 34 individually modulates each separate beam. As will be further explained, the digital data 36 also includes test data obtained during the initial testing step, as previously outlined, and shown in FIG. 2B. For example, the test data 36 can indicate the location of the defective components 12D (FIG. 4), and the location of defective component contacts 28 (FIG. 3A). Similarly, the digital data 36 can indicate the locations of the "good" components 12 on the substrate 10.

Still referring to FIG. 3, the laser scanner 26 also includes a rotating polygon 38 configured to receive a modulated laser beam 40 from the modulator 34. The rotating polygon 38 includes reflective facets which transmit a modulated and reflected laser beam 42 onto a scan lens 44. The scan lens 44 focuses modulated, reflected and focused laser beams 46 onto the radiant sensitive film 24. The modulated, reflected and focused laser beam 46 exposes the radiant sensitive film 24 such that following a subsequent development step, the desired pattern is contained on the radiant sensitive film 24.

As shown in FIG. 2F, following exposure and development, the radiant sensitive film 24 forms a mask 25 that can be used to etch the redistribution layer 20 with the pattern of conductors 22. Either a wet or a dry etch process can be used to etch the redistribution layer 20 to form the conductors 22. Following this etch step, the mask 25 can be "stripped" or "lifted off" using a suitable process.

Although the method of the invention has been illustrated using a subtractive process (i.e., etching through the mask 25 to form the conductors 22), it is to be understood that the method of the invention can also be practiced using an additive process (i.e., deposition through a mask to form the conductors 22). Such an additive process is illustrated in FIGS. 2G–2J.

Figure 2G:
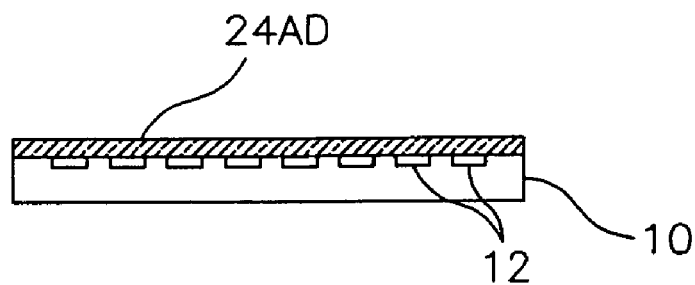
FIGS. 2G–2J are schematic cross sectional views illustrating broad steps in an "additive" embodiment of the method.
Figure 2H:
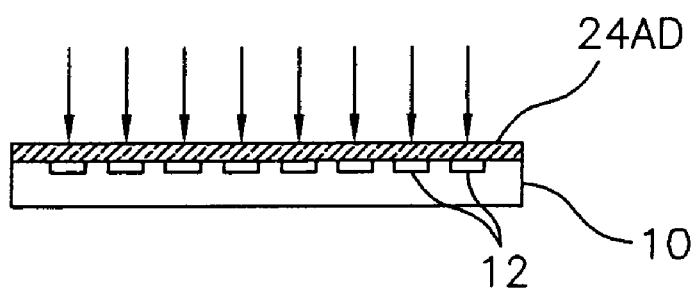
Figure 2I:
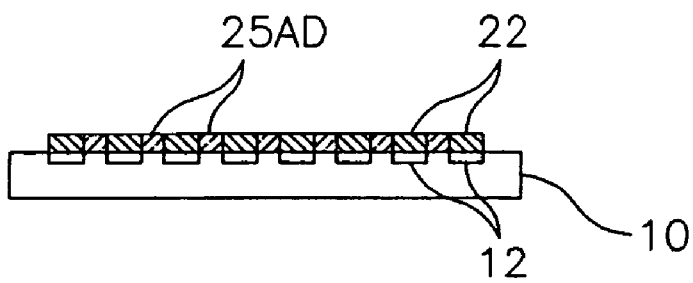
Figure 2J:
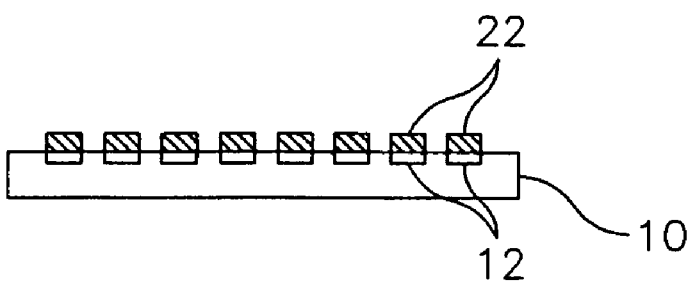

Initially, as shown in FIG. 2G, a radiant sensitive film 24AD is formed on the components 12, and on the substrate 10, substantially as previously described. Next, as shown in FIG. 2H, the radiant sensitive film 24AD is exposed using the laser scanner 26 and a laser imaging process substantially as previously described. As shown in FIG. 2I, development of the exposed radiant sensitive film 24AD forms a mask 25AD. The mask 25AD includes mask openings in a required pattern for forming the conductors 22. The conductors 22 can be deposited into the mask openings using a suitable process such as screen printing, squeegeeing or evaporating a conductive film. Next, as shown in FIG. 2J the mask 25AD is stripped or "lifted off" leaving the pattern of conductors 22.

Figure 4:
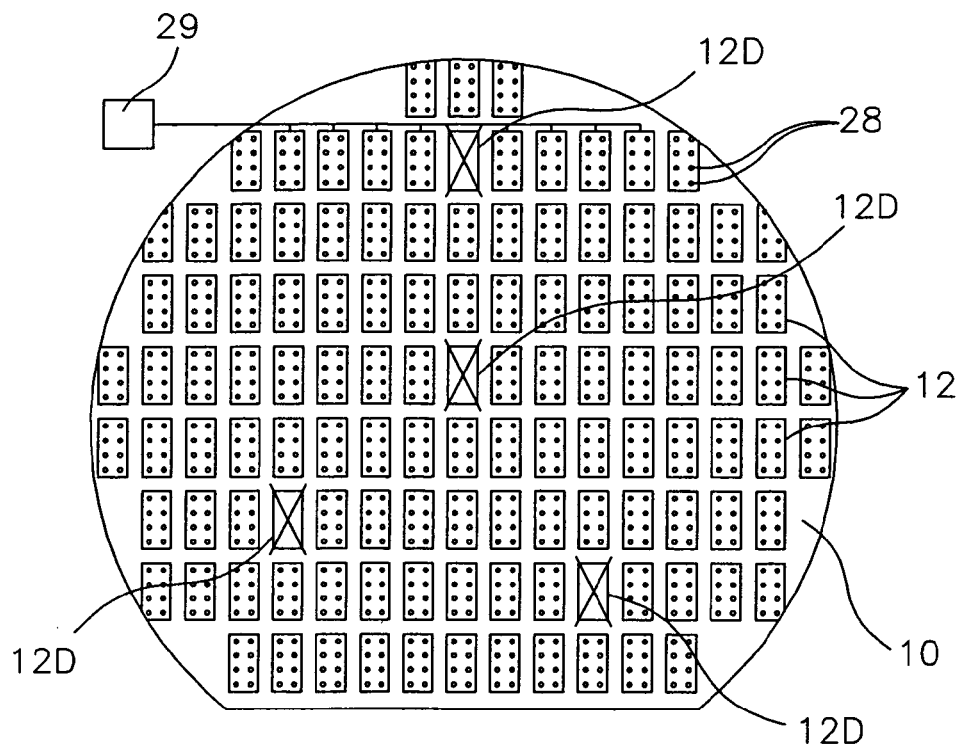
FIG. 4 is a plan view of the semiconductor substrate during a testing step of the method.
Figure 5:
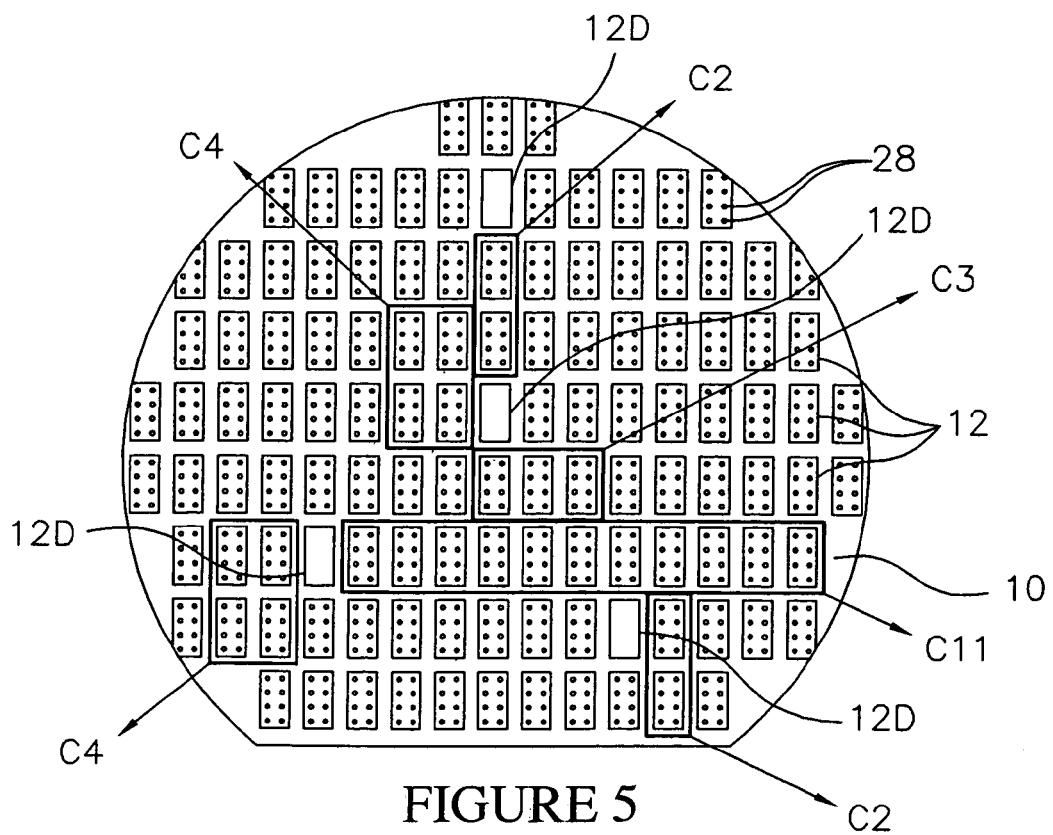
FIG. 5 is a plan view of the semiconductor substrate during a clustering step of the method.

Referring again to FIG. 1, the redistribution layer 20 can be etched with the conductors 22 in patterns selected to achieve different objectives. As a first example, the redistribution layer 20 can be etched to repair or re-configure defective components 12D (FIGS. 4 and 5). Specifically, the initial testing step identifies the defective components 12D and this information is contained in the digital data 36 (FIG. 3) supplied to the modulator 34. Some defects can be corrected by providing conductors 22 that substitute redundant circuitry contained on the defective components 12D for defective circuitry.

Other defects can be corrected by configuring or re configuring the component 12D in a particular electrical format. For example, a memory component (e.g., DRAM) may be defective when configured as a 1 Meg×16 device (i.e., 1 megabit deep by 16 bits wide=16 megabits of total memory). However, the memory component may not be defective when configured as a 4 Meg×4 device (i.e., 4 megabits deep by 4 bits wide=16 megabits of total memory). By electrically connecting, or alternately electrically isolating, selected component contacts 28 using the conductors 22 different configurations can be achieved.

As also shown in FIG. 1, and illustrated in FIG. 4, the redistribution layer 20 can be etched with patterns of conductors 22 that electrically isolate the defective components 12D. A wafer level burn-in test can then be performed on the substrate 10 to burn-in the components 12. During burn-in test, the substrate 10 is placed in a burn-in oven and subjected to temperature cycling (e.g., −55° C. to 150° C.) for a time period of from several minutes to several hours or more. At the same time, the integrated circuits on the components 12 are placed under an electrical bias. The burn-in test is intended to electrically and physically stress the integrated circuits and detect failures.

High volume burn-in testing may require the use of "shared" signal and power circuits among many components 12. Sometimes, one or more defective components 12D may be defective in a way that could disrupt the normal use of shared resources. For example, a defective component 12D may develop a direct internal short between power and ground. This short can drop the voltage on a shared power bus to a level insufficient to power the remaining components 12, which will then also fail the burn-in test.

However, using the method of the invention, during the wafer level burn-in test the defective components 12D remain electrically isolated by the configuration of the conductors 22 on the substrate 10, or on the defective components 12D. Shared resources can thus be employed without the possibility of compromising testing, due to the defective components 12D. For example, as shown in FIG. 4, burn-in test circuitry 29 can be electrically connected in series to all of the components 12 contained in a row, except for the defective component 12D in the row.

As also shown in FIG. 1, and illustrated in FIG. 5, the redistribution layer 20 can be etched with patterns of conductors 22 that provide selected component clusters C2, C3, C4, or C11. As used herein the term "cluster" means a plurality of discrete components electrically connected to form a different component or an assembly.

In particular, the patterns of conductors 22 can be configured to electrically connect the components 12 in clusters C2, C3, C4, or C11 that avoid the defective components 12D. In addition, the data 36 from the testing step can be used to determine the "best case" scenario for connecting the components 12 in clusters to give the highest yield for a given cluster requirement. Also, in determining the configuration of the clusters C2, C3, C4, or C11, the capabilities of the wafer dicing method (e.g., saw cutting) must be factored in to achieve the desired configuration of clusters.

Following a subsequent singulation process, the clusters C2, C3, C4, or C11 can be used to form packages, modules, and other electronic assemblies, that incorporate the multiple components 12. At the same time, defective components 12D can be eliminated from the singulated clusters C2, C3, C4, or C11 such that a yield of the clustered substrate 10 (e.g., wafer yield) is improved.

Figure 6:
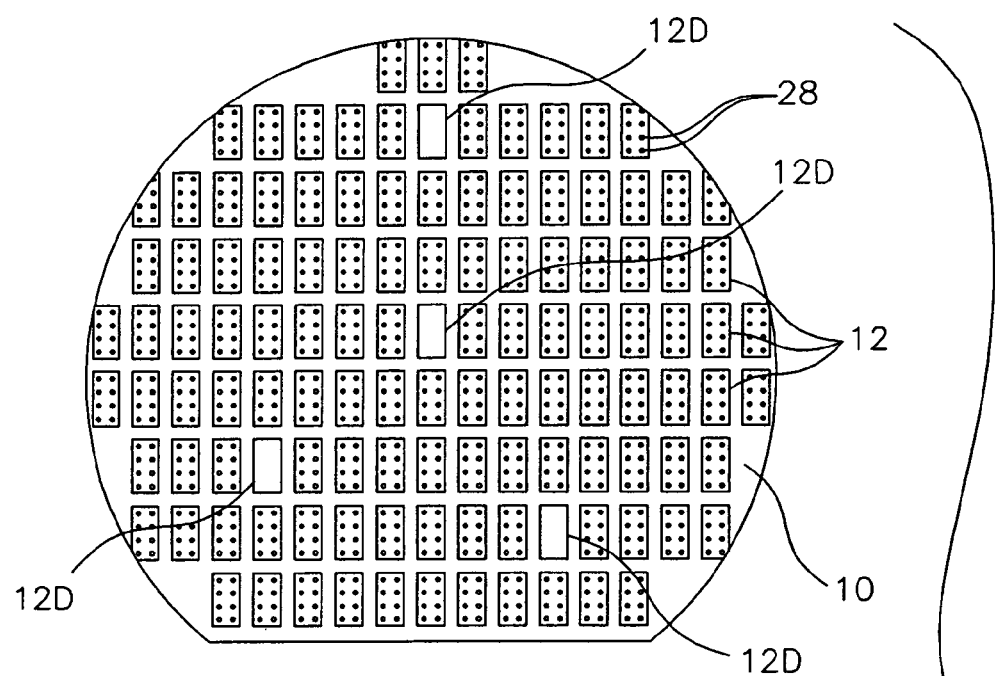
FIG. 6 is a plan view of the semiconductor substrate and a test board constructed in accordance with the invention.
Figure 6:
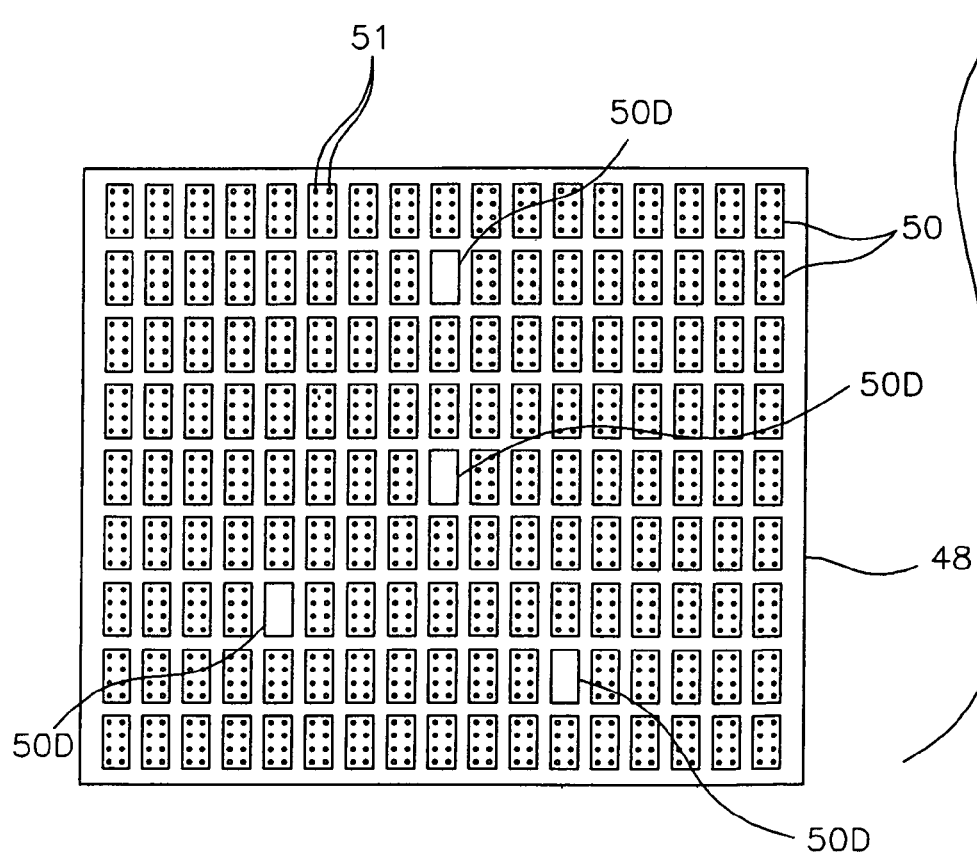

Referring to FIG. 6, in an alternate embodiment, the data 36 from the testing step can be used to etch the redistribution layer 20 (FIG. 2C), and to also fabricate a test board 48 for burning-in, or otherwise testing, the substrate 10. Specifically, the test board 48 can be fabricated with test sites 50 configured to electrically engage the good components 12 on the substrate 10 but not the defective components 12D. As such, the test sites 50 can include contacts 51 that are configured to electrically contact the component contacts 28 on the good components 12. However, the test board 48 can also include test sites 50D configured to electrically isolate the defective components 12D on the substrate 10. The test board 48 can be patterned with the test sites 50, 50D by laser imaging a mask substantially as previously described. Essentially the same data 36 (FIG. 3) can be used for fabricating the test board 48, as was used to pattern the redistribution layer 20.

Figure 7:
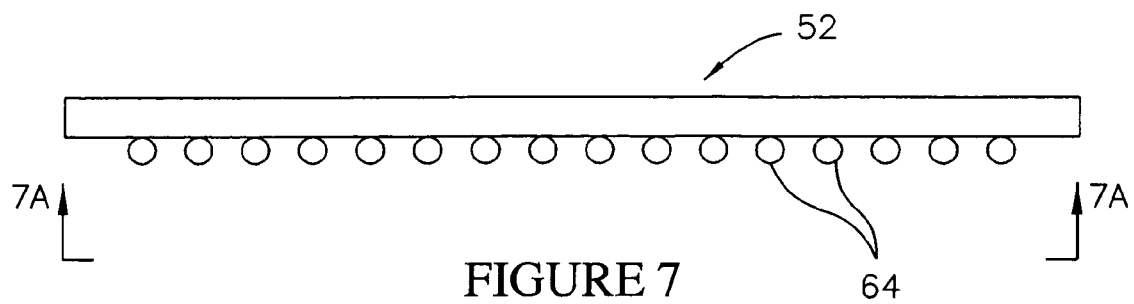
FIG. 7 is a side elevation view of a semiconductor package constructed in accordance with the invention.
Figure 7A:
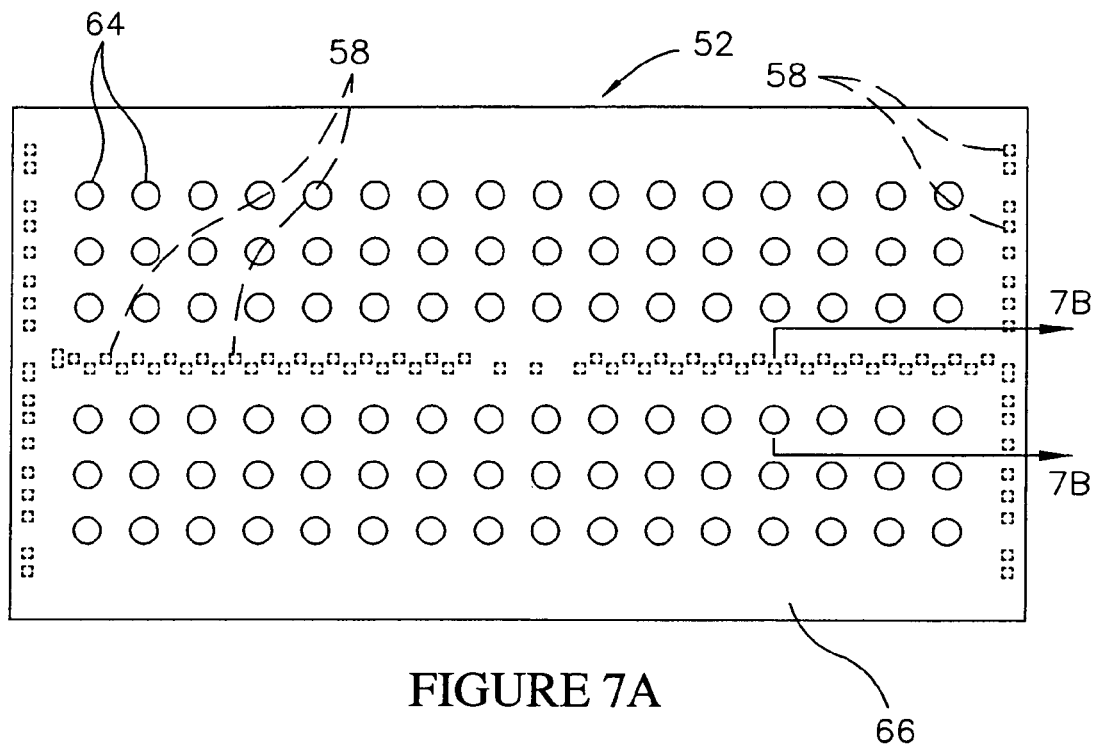
FIG. 7A is a bottom view of the package taken along line 7A—7A of FIG. 7.
Figure 7B:
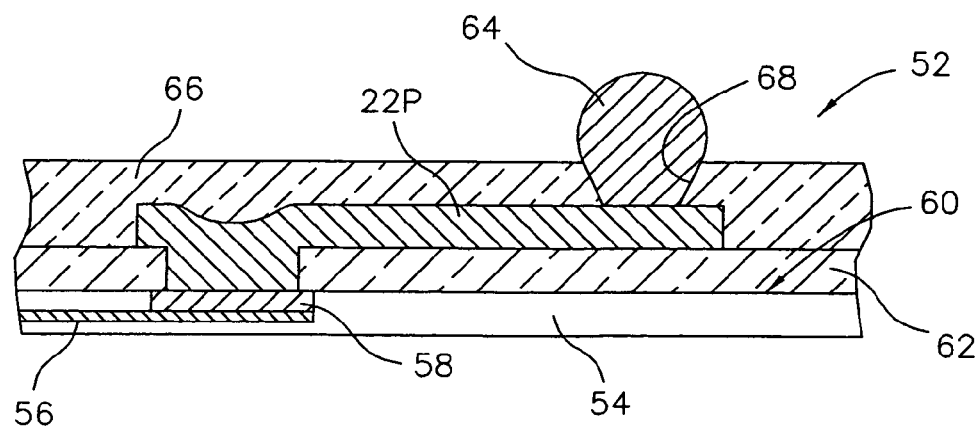
FIG. 7B is an enlarged cross sectional view of the package taken along section line 7B—7B of FIG. 7A.

Referring to FIGS. 7–7B, a semiconductor package 52 constructed in accordance with the method of the invention is illustrated. As shown in FIGS. 7 and 7A, the package 52 includes a plurality of terminal contacts 64, which comprise solder balls in a grid array. As shown in FIG. 7B, the package 52 also includes a semiconductor die 54 containing integrated circuits 56 in a desired configuration. The die 54 includes bond pads 58 in electrical communication with the integrated circuits 56 contained on the die 54. As shown in FIG. 7A, the bond pads 58 are formed along the center and lateral edges of the die 54. The die 54 also includes a passivation layer 62 formed on a face 60 of the die 54. The passivation layer 62 comprises an electrically insulating layer such as BPSG, polyimide or similar material.

As shown in FIG. 7B, the package 52 also includes a plurality of conductors 22P configured to electrically connect the bond pads 58 on the die 54 and the terminal contacts 64 on the package 52. The conductors 22P can be formed by a laser imaging process substantially as previously described. The terminal contacts 64 can comprise solder bumps or balls bonded to the conductors 22P or to bond pads thereon using a suitable bonding process such as soldering, welding or brazing.

As also shown in FIG. 7B, an outer protective layer 66, which comprises an electrically insulating material, such as polyimide or a patterned resist, is formed on an outside surface of the package to protect the conductors 22P. The outer protective layer 66 can include openings 68 for the terminal contacts formed using a laser imaging process.

For fabricating the package 52 the following process sequence can be utilized.

1. Provide a substrate 10 (FIG. 3A) containing a plurality of dice 54 having integrated circuits 56, bond pads 58 and passivation layers 62.

2. Test the dice 54 using the test circuitry 14 (FIG. 2B) to evaluate and map the dice 54 on the substrate 10. As previously described, testing can include functionality testing and parametric testing. For example, some of the dice may have the speed and functional characteristics required for chip scale packages. Accordingly, these dice can be further processed. However, some of the dice 54 may not be suitable for chip scale packages, but may be suitable for conventional plastic packages such as TSOP, TQFP or DIP packages. These dice may be left alone during the fabrication process and singulated for subsequent processing.

3. Form a redistribution layer 20 on the substrate 10 and the dice 54 using a deposition process substantially as previously described. The redistribution layer 20 can comprise a highly conductive metal such as copper, aluminum, titanium, tungsten, tantalum, molybdenum or alloys thereof.

4. Form a radiant sensitive film 24 (FIG. 2D) on the redistribution layer 20. The radiant sensitive film 24 can comprise a wet film or a dry film, deposited to a desired thickness as previously described, using techniques that are known in the art.

5. Expose the radiant sensitive film 24 using a laser scanner 26 (FIG. 3), and a laser imaging process substantially as previously described. During the laser imaging process, data from the test step can be used to repair or re-configure defective dice 54, to isolate defective dice 54 for burn-in, or to fabricate a matching test board 48 (FIG. 6). In addition, a package substantially similar to package 52, can be fabricated using clusters of multiple dice. Because the laser scanner 26 (FIG. 3) writes the pattern directly onto the radiant sensitive film 24 a photomask is not required. In addition, the data from the test step can be used "on the fly" to facilitate volume manufacture.

6. Develop the radiant sensitive film 24 to form an etch mask for etching the redistribution layer 20. Depending on the material used to form the radiant sensitive film 24 a suitable commercial developer can be used to develop the radiant sensitive film 24.

7. Etch the redistribution layer 20 to form the conductors 22P (FIG. 7B). The etch step can be performed using a wet etchant that selectively etches the redistribution layer 20. As an example, a wet etchant such as $H_3PO_4$ can be used to etch an aluminum redistribution layer 20.

Alternately, rather than the subtractive process of steps 3–7, an additive process can be used to form the conductors 22P. Such an additive process can be performed by depositing a conductive film through openings in a laser imaged radiant sensitive film 24AD (FIG. 2H), substantially as previously described.

8. Form the outer protective layer 66 and the pattern of openings 68 in the outer protective layer 66 for the terminal contacts 64. The outer protective layer 66 can be initially blanket deposited using a suitable deposition process, such as spin on, CVD, PCVD or evaporation. One method for forming the openings 68 is to deposit a layer of resist on the blanket deposited layer. The layer of resist can then be exposed using a direct imaging process, substantially as previously described, to form a mask for etching the openings 68. As another alternative, the outer protective layer 66 can comprise a photoimageable polymer, such as a layer of resist that is exposed using a direct imaging process and then developed to form the openings 68.

9. Attach the terminal contacts 64 to the conductors 22P using a suitable process such as soldering, brazing or ball bumping.

10. Burn-in test the dice 54 on the substrate 10. The burn-in test can be performed by electrically isolating selected dice 54, such as defective dice, as previously described.

11. Singulate (e.g., saw cut) the substrate 10 into individual packages 52.

Figure 8A:
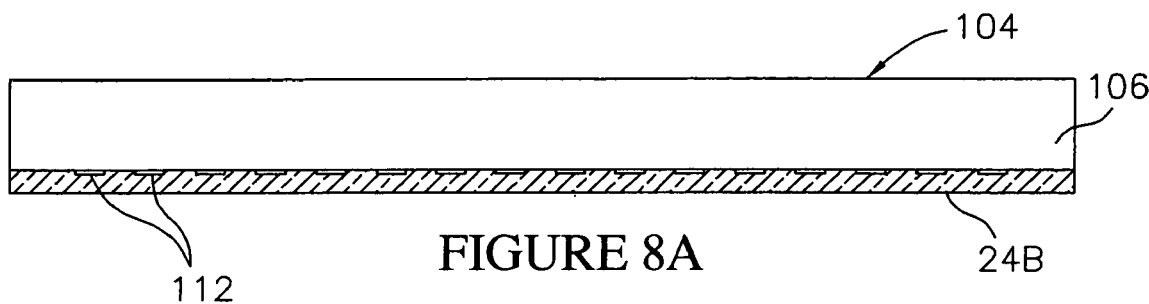
FIGS. 8A–8D are schematic cross sectional views illustrating steps in an alternate embodiment of the invention for constructing a semiconductor component with a solder mask or a rigidifying mask.

Referring to FIGS. 8A–8D, a semiconductor package 104 fabricated in accordance with an alternate embodiment of the invention is illustrated. As shown in FIG. 8A, the semiconductor package 104 includes a package body 106 that contains a semiconductor die (not shown). The package body 104 can comprise any material used in semiconductor packaging such as plastic, ceramic, or an organic material, such as a glass filled resin. In addition, the package body 106 includes a plurality of land pads 112 in electrical communication with the integrated circuits contained on the die.

Initially, as shown in FIG. 8A, a radiant sensitive film 24B is deposited on the package body 106 and on the land pads 112. The radiant sensitive film 24B can comprise a commercial resist as previously described, or another photoimageable polymer such as a thick film resist. One suitable thick film resist is a negative tone resist sold by Shell Chemical under the trademark "EPON RESIN SU-8". The resist can be deposited in layers to a thickness of from about 3–50 mils. The resist also includes an organic solvent (e.g., gamma-butyloracton), and a photoinitiator. A conventional resist coating apparatus, such as a spin coater, or a meniscus coater, can be used to deposit the resist in viscous form onto the package body 106. The deposited resist can then be partially hardened (soft-baked) by heating to about 95° C. for about 15 minutes or longer.

Figure 8B:
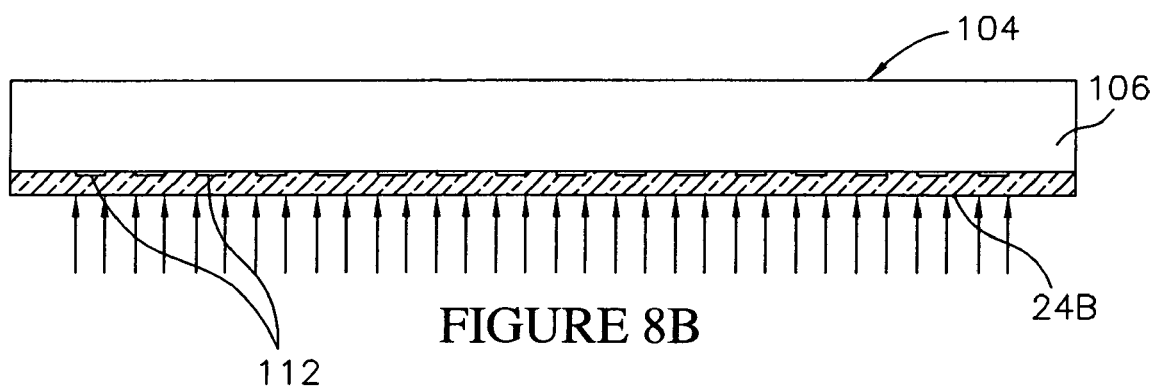

Next, as shown in FIG. 8B, the radiant sensitive film 24B can be exposed using a laser scanner 26 (FIG. 3) substantially as previously described, for radiant sensitive film 24 (FIG. 2D). In this case, digital data 36 (FIG. 3) for the laser scanner 26 is dependent on the geometry and locations of the land pads 112.

Figure 8C:
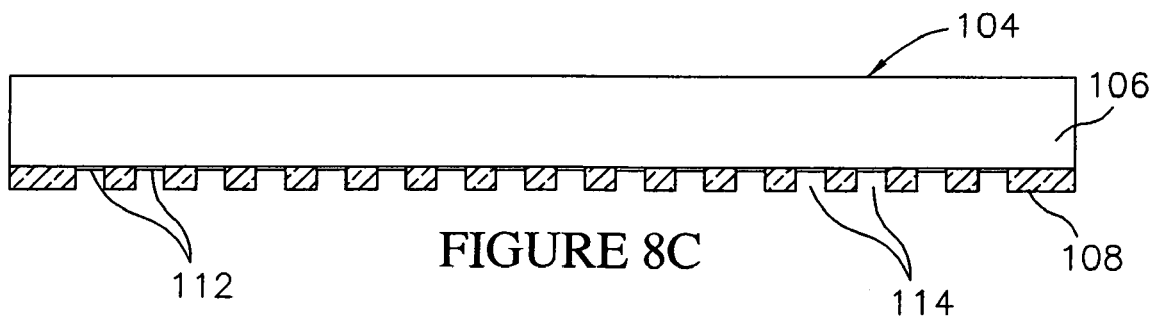

Next, as shown in FIG. 8C, the radiant sensitive film 24 is developed, and cured if required, to form a mask 108. The mask 108 includes openings 114 aligned with the land pads 112.

Figure 8D:
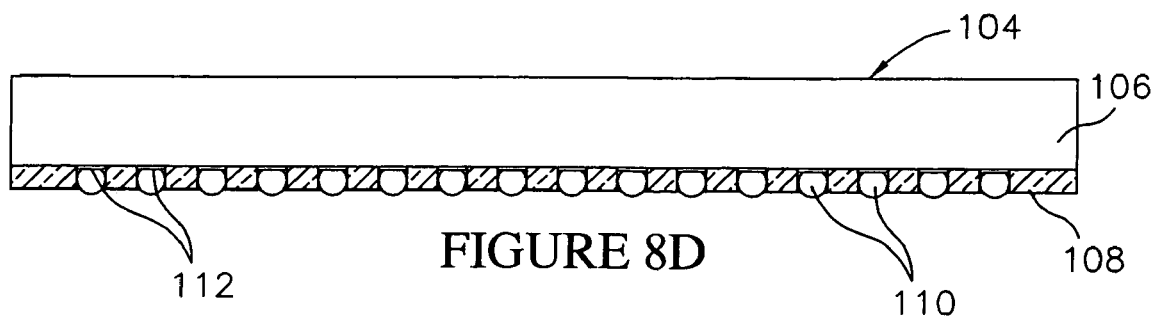

Next, as shown in FIG. 8D, terminal contacts 110 are placed in the openings 114 and bonded to the land pads 112. For example the terminal contacts 110 can comprise balls formed of solder or other suitable metal. Any conventional bonding process such as solder reflow, laser reflow, welding, brazing, or conductive adhesive bonding, can be used to bond the terminal contacts 110 to the land pads 112. The mask 108 has a thickness that is less than a height of the terminal contacts 110 such that electrical connections can be made to the terminal contacts 110 by electrodes on a mating component, such as a circuit board or module substrate. In addition, the mask 108 can serve the function of a solder mask, or alternately a rigidifying mask, that helps to anchor the terminal contacts 110 to the land pads 112.

Depending on the application, a thickness of the mask 108 (and the radiant sensitive film 24B) can be selected as required. For solder mask applications, the mask 108 (and the radiant sensitive film 24B) can be made very thin (e.g., several microns or less). For rigidifying applications, the mask 108 (and the radiant sensitive film 24B) can have a thickness approaching the height of the terminal contacts 110 (e.g., from ¼ to ¾ a height of the terminal contacts 110).

Thus the invention provides an improved method for fabricating and testing semiconductor components, improved semiconductor components fabricated using the method and a system for performing the method. While the invention has been described with reference to certain preferred embodiments, as will be apparent to those skilled in the art, certain changes and modifications can be made without departing from the scope of the invention as defined by the following claims.

What is claimed is:

1. A test board configured for testing semiconductor components on a substrate including a plurality of good components and at least one defective component, each component having a plurality of component contacts, the test board comprising:

a plurality of first test sites comprising a plurality of contacts configured to electrically engage the component contacts on the good components;

a second test site configured to electrically isolate the defective component; and a plurality of conductors in a pattern configured to electrically connect the first test sites to a test circuitry and to electrically isolate the defective component, the pattern containing information from testing of the semiconductor components representing locations of the good components, the defective component and the component contacts.

2. The test board of claim 1 wherein the test board includes a patterned metal layer containing the conductors.

3. The test board of claim 1 wherein the test board is configured to perform a burn-in test and the second test sites are configured to electrically isolate the defective component during the burn-in test.

4. The test board of claim 1 wherein the substrate comprises a semiconductor wafer, and the components comprise dice or packages.

5. A test board configured for testing semiconductor components on a substrate including a plurality of good components and at least one defective component identified using a component testing process, each component having a plurality of component contacts, the test board comprising:

a plurality of first test sites configured to electrically engage the component contacts on the good components;

a plurality of second test sites configured to electrically isolate the component contacts on the defective component; and a plurality of conductors having a pattern containing information from the component testing process for configuring the first test sites to electrically engage the component contacts on the good components and the second test sites to electrically isolate the component contacts on the defective component.

6. The test board of claim 5 wherein the substrate comprises a semiconductor wafer, and the components comprise semiconductor dice or semiconductor packages.

7. The test board of claim 5 wherein the component contacts comprise bond pads.

8. The test board of claim 5 further comprising a plurality of patterns of contacts in electrical communication with the conductors configured to electrically engage the component contacts.

9. A test board configured for testing semiconductor components on a substrate including a plurality of good components and at least one defective component identified using a testing process, each component having a plurality of component contacts, the test board comprising:

a plurality of test sites having a plurality of contacts configured to electrically engage the component contacts on the components; and a plurality of conductors having a pattern containing information from the component testing process which configures the contacts on the test sites to electrically engage the component contacts on the good components and to electrically isolate the component contacts on the defective component.

10. The test board of claim 9 wherein the substrate comprises a semiconductor wafer, and the components comprise semiconductor dice or semiconductor packages.

11. The test board of claim 9 wherein the test sites are configured to perform burn in testing.

* * * * *